United States Patent
Ramezani et al.

[11] Patent Number: 5,986,906
[45] Date of Patent: Nov. 16, 1999

[54] CONVERTER CIRCUIT ARRANGEMENT

[75] Inventors: Ezatollah Ramezani, Möriken; Jürg Waldmeyer, Dottikon, both of Switzerland

[73] Assignee: Asea Brown Boveri AG, Baden, Switzerland

[21] Appl. No.: 08/897,360

[22] Filed: Jul. 21, 1997

[30] Foreign Application Priority Data

Aug. 9, 1996 [DE] Germany ............... 196 32 173

[51] Int. Cl.$^6$ .................................................. H02M 7/122
[52] U.S. Cl. ................................................. 363/58; 363/136
[58] Field of Search ................... 363/50, 55, 56, 363/57, 58, 135, 136, 137

[56] References Cited

U.S. PATENT DOCUMENTS

| | | | |
|---|---|---|---|
| 4,881,159 | 11/1989 | Holtz et al. | 363/58 |
| 4,888,676 | 12/1989 | Zurcher | 363/58 |
| 4,926,306 | 5/1990 | Ueda et al. | 363/58 |
| 5,461,556 | 10/1995 | Horie et al. | 363/58 |
| 5,515,259 | 5/1996 | Stephenson | 363/59 |
| 5,534,114 | 7/1996 | Cutright et al. | 162/139 |
| 5,675,482 | 10/1997 | Suzuki et al. | 363/58 |
| 5,768,114 | 6/1998 | Gruning et al. | 363/58 |

FOREIGN PATENT DOCUMENTS

| | | |
|---|---|---|
| 0 660 496 A2 | 6/1995 | European Pat. Off. . |
| 44 20 564 A1 | 12/1995 | Germany . |
| 578 276 | 7/1976 | Switzerland . |

*Primary Examiner*—Adolf Deneke Berhane
*Attorney, Agent, or Firm*—Oblon, Spivak, McClelland, Maier & Neustadt, P.C.

[57] ABSTRACT

A converter circuit arrangement is specified. An extremely compact structure is achieved by virtue of the fact that the current rise limiting inductor concentrically surrounds the second stack containing diode and resistor. In particular, the inductor can be designed as a wire helix surrounding the stack. A very compact structure of the converter is produced, furthermore, by virtue of the fact that the first and second stacks, that is to say the stack of the switches and the stack of the snubber, belong to a common clamping lattice.

6 Claims, 1 Drawing Sheet

CONVERTER CIRCUIT ARRANGEMENT

BACKGROUND OF THE INVENTION

1. Field of the Invention

The invention relates to the field of power electronics. It is based on a converter circuit arrangement according to the preamble of the first claim.

2. Discussion of Background

A converter circuit arrangement of the generic type has already been described in European Patent Application EP 0 660 496 A2.

A converter circuit arrangement of this type comprises at least one phase module, comprising a series circuit formed by at least two reverse conducting switches, for example GTOs, with a reverse-connected parallel diode, a central node of the series circuit forming a load terminal, as well as a snubber. The snubber comprises at least one current rise limiting inductor, which is arranged in series with the switches, and a series circuit formed by a resistor and a snubber diode, which is arranged in parallel with the inductor. In the context of the aforementioned patent application, an attempt is then made to achieve a low-inductance structure by a skillful arrangement and assignment of the elements. A structure having the lowest possible inductance is a desirable aim particularly with regard to higher switching frequencies and slope gradients. For this purpose, the switches and the diodes are combined to form a stack in each case. The snubber, that is to say resistors and inductors, is arranged underneath the stacks.

SUMMARY OF THE INVENTION

Accordingly, one object of the invention is to provide a novel converter circuit arrangement which results from development of the prior art and is constructed as compactly as possible. This object is achieved, in the case of a converter circuit arrangement of the typed mentioned in the introduction, by means of the features of the first claim.

The core of the invention, then, is that the current rise limiting inductor concentrically surrounds the second stack containing diode and resistor. In particular, the inductor can be designed as a wire helix surrounding the stack. A very compact structure of the converter results from the fact that the first and second stacks, that is to say the stack of the snubber and the stack of the switches, belong to a common clamping lattice. For the purpose of cooling, liquid-cooled cooling boxes can be arranged between the individual elements of a stack. The use of a silicon resistor which is accommodated, in particular, in a common housing with the snubber diode produces an even more compact structure. The switches comprise reverse conducting GTOs or GTOs with which a freewheeling diode is reverse-connected in parallel. The freewheeling diode can be realized on the same wafer as the GTO and be accommodated in a common pressure contact housing.

The snubber capacitor Cs which is necessary in the prior art mentioned in the introduction can be eliminated in the case of the invention, for example, by treating the GTO of the switches like a transistor during turn-off. In the turn-off operation, the gate-cathode junction is depleted of charge carriers by a suitable rate of current rise at the gate before the feedback mechanism of the GTO has an opportunity to restrict the anode current and before uncontrollable triggering can take place due to lateral inhomogeneities in the active section. For this purpose, the rate of current rise at the gate is selected in such a way that the depletion of the charge carriers at the gate-cathode junction takes place within $\leq 1$ $\mu s$. The rate of voltage rise dV/dt is in this case determined by the GTO itself and is of the order of magnitude of a few kV/$\mu s$. If the GTO is treated like a transistor during turn-on as well, that is to say that a sufficiently high rate of current rise at the gate is produced (for example reaching of the load current value within 1 $\mu s$ to 2 $\mu s$), then the size of the current limiting inductor can also be reduced. As a result, the gate-cathode junction is flooded with charge carriers so quickly that the GTO turns on like a transistor without being endangered by the otherwise occurring lateral inhomogeneities in the current density.

This type of driving is also known as "hard driving".

The influence of the freewheeling diode reverse-connected in parallel with the GTO should also not be underestimated. In the case of a converter having a DC voltage intermediate circuit (voltage converter), the turn-on of the GTO is always combined with the turn-off of the freewheeling diode lying opposite. This freewheeling diode is subjected to the same rate of current rise in terms of magnitude. When the snubber capacitor is eliminated, the dV/dt occurring across the diode is determined by the diode itself and is of the order of magnitude of a few kV/$\mu s$. An improvement in the diode properties can be achieved—as in the case of the GTO as well—by using a stop layer. The GTO and freewheeling diode thus have the same technology, and this affords the possibility of integrating the two elements in the same pressure contact housing, and in particular on the same silicon wafer. A further means for increasing the dI/dt loading capability of the diode during turn-off consists in the use of local life settings (axially and laterally e.g. by means of proton irradiation).

All of these measures contribute to an extremely compact converter. Further exemplary embodiments emerge from the corresponding dependent claims.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

Figure 1:
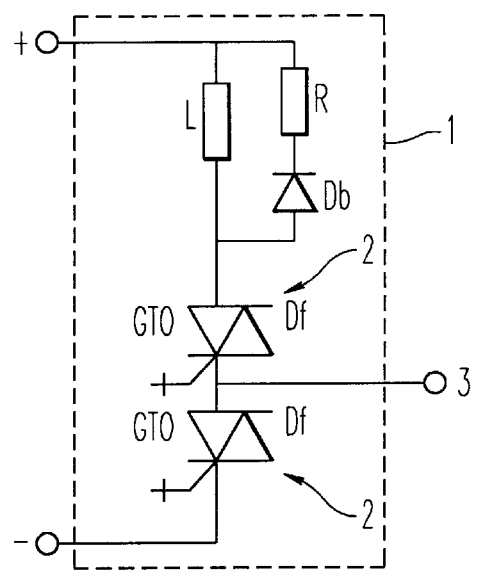
FIG. 1 shows an equivalent circuit of a converter circuit arrangement for which the invention is suitable.

The reference numerals used in the drawings and their meanings are summarized in the List of Designations.

DESCRIPTION OF THE PREFERRED EMBODIMENTS

Referring now to the drawings, wherein like reference numerals designate identical or corresponding parts throughout the several views, FIG. 1 shows an equivalent circuit diagram of a circuit for which the invention is advantageously employed. An arm or phase module 1 of a converter is illustrated. Such a phase module, a plurality of which can be connected in parallel in the framework of a converter, comprises a series circuit formed by at least two switches, in particular gate turn-off thyristors GTO with freewheeling diode Df reverse-connected in parallel. The series circuit formed by the switches is connected via a snubber to a DC voltage source having a positive terminal+ and a negative terminal−. The snubber serves to protect the switches 2. In the case of the invention, it comprises only a current rise limiting inductor L and, in parallel therewith, a series circuit formed by a snubber diode Db and a resistor R. The central, common node of the series circuit of the switches 2 forms a load terminal 3, to which a load, for example a three-phase motor, can be connected. By alternately switching the switches 2, either the positive terminal or the negative terminal of the DC voltage source can be connected to the load terminal, thereby producing an alternating voltage across the load. The method of operation of such a circuit is assumed to be known and is therefore not explained in any more detail at this point.

If such a converter or at least the arms or phase modules can be constructed compactly and with low losses, then the way to higher switching frequencies is open. As a result, the control dynamic range is improved and the outlay for controlling the distortion reactive volt-amperes can be reduced.

Figure 2:
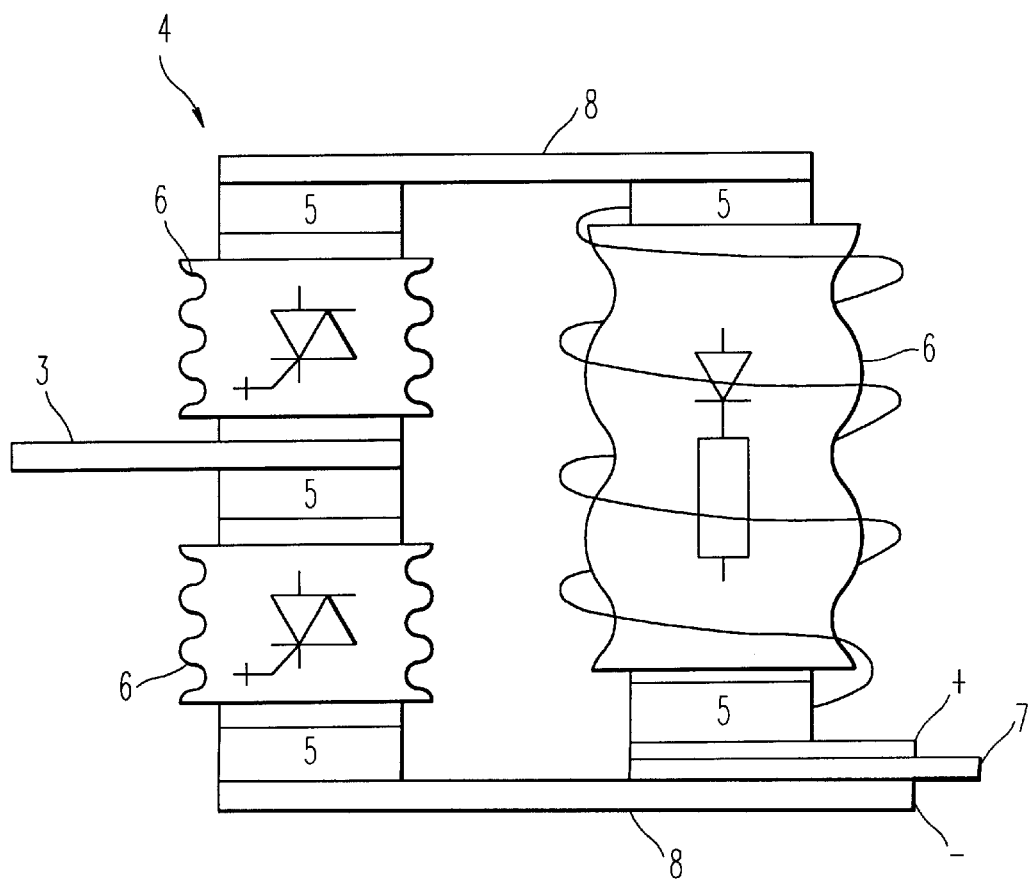
FIG. 2 shows a detail of a converter structure according to the invention.

According to the invention, an extremely compact structure is now achieved by virtue of the fact that the switches 2, that is to say GTOs with freewheeling diodes Df, form a first stack and the snubber diode Db and the resistor R form a second stack, and that the inductor L concentrically surrounds the second stack. This can be achieved by means of a wire helix, for example. This produces a structure as illustrated in FIG. 2: the two stacks are arranged between two electrically conductive pressure contact plates 8. They are preferably part of a common clamping lattice 4. The lower pressure contact plate in FIG. 2 simultaneously forms the negative terminal—of the DC voltage source. An insulation layer 7, to which a further contact plate connected to the positive terminal of the DC voltage source is fitted, is provided in the region of the second stack.

The GTOs with reverse-connected parallel freewheeling diode Df are preferably accommodated in a common pressure contact housing 6. The two elements can also be integrated on a common wafer. Heat sinks 5, for example in the form of cooling boxes through which liquid flows, can be provided between two neighboring housings and between the pressure contact plates 8 and the pressure contact housings 6. The resistor R and the snubber diode Db are likewise accommodated in a pressure contact housing. Particular preference is given to using resistors made of silicon, which have a sufficient resistance stability in the temperature range which is relevant in practice as a result of special processes (for example gold diffusion or very intense electron irradiation). During turn-off of the switches, this resistor R with the snubber diode Db connected in series absorbs the energy stored in the inductor and thereby reduces the overvoltage across the switch. The size of the resistor R depends on the permissible voltage overshoot and on the time within which the energy in the inductor is to be dissipated. A particular advantage of using a silicon resistor is that a pressure contact housing can be used for the housing. The overvoltage protection unit, resistor R and diode Db, can consequently bridge the current rise limiting inductor L virtually non-inductively during turn-off.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A converter circuit arrangement comprising at least one phase module (1), which can be connected to a DC voltage source and comprises a series circuit formed by at least two switches (2), in particular gate turnoff thyristors (GTO) with freewheeling diode (Df) reverse-connected in parallel, and at least one current limiting inductor (L), with which current limiting inductor (L) a series circuit formed by a resistor (R) and a snubber diode (Db) is connected in parallel, a central node of the series circuit of the switches (2) forming a load terminal (3), the switches (2) forming a first stack and the series circuit formed by the snubber diode (Db) and the resistor (R) forming a second stack, wherein the inductor (L) concentrically surrounds the second stack.

2. The circuit arrangement as claimed in claim 1, wherein the inductor (L) is designed as a wire helix.

3. The circuit arrangement as claimed in claim 1 or 2, wherein the first and the second stack belong to a common clamping lattice (4).

4. The circuit arrangement as claimed in claim 1 or 2, wherein heat sinks (5), in particular liquid-cooled heat sinks, are inserted between the switches (2) and between the snubber diode (Db) and the resistor (R).

5. The circuit arrangement as claimed in claims 1 or 2, wherein the resistor (R) is a silicon resistor and, in particular, is accommodated with the snubber diode (Db) in a common pressure contact housing (6).

6. The circuit arrangement as claimed in claims 1 or 2, wherein the gate turn-off thyristors (GTO) and the corresponding freewheeling diodes (Df) are integrated in a common pressure contact housing (6), and in particular on a common silicon wafer.

\* \* \* \* \*